US006883131B2

(12) United States Patent
Acton

(10) Patent No.: US 6,883,131 B2
(45) Date of Patent: Apr. 19, 2005

(54) XOR PROCESSING INCORPORATING ERROR CORRECTION CODE DATA PROTECTION

(75) Inventor: John D. Acton, Danville, CA (US)

(73) Assignee: Sun Microsystems, Inc., Santa Clara, CA (US)

(*) Notice: Subject to any disclaimer, the term of this patent is extended or adjusted under 35 U.S.C. 154(b) by 568 days.

(21) Appl. No.: 09/967,141

(22) Filed: Sep. 28, 2001

(65) Prior Publication Data
US 2003/0066010 A1 Apr. 3, 2003

(51) Int. Cl.[7] .............................................. H03M 13/29
(52) U.S. Cl. ........................ 714/755; 714/758; 714/770
(58) Field of Search ................................ 714/755, 758, 714/770

(56) References Cited

U.S. PATENT DOCUMENTS

| 4,277,844 | A | * | 7/1981 | Hancock et al. ............ 714/755 |
| 4,413,339 | A | * | 11/1983 | Riggle et al. ............... 714/765 |
| 4,993,030 | A | * | 2/1991 | Krakauer et al. ............. 714/6 |
| 5,220,569 | A | * | 6/1993 | Hartness ..................... 714/758 |
| 5,375,127 | A | | 12/1994 | Leak et al. |
| 5,453,998 | A | * | 9/1995 | Dang ......................... 714/805 |
| 5,613,088 | A | * | 3/1997 | Achiwa et al. ............. 711/155 |
| 5,737,344 | A | * | 4/1998 | Belser et al. ............... 714/766 |
| 5,896,406 | A | | 4/1999 | Berry et al. |
| 5,950,225 | A | | 9/1999 | Kleiman |
| 6,070,182 | A | | 5/2000 | Rao et al. |
| 6,192,499 | B1 | | 2/2001 | Yang |
| 6,357,030 | B1 | * | 3/2002 | Demura et al. ............. 714/755 |
| 6,457,153 | B1 | * | 9/2002 | Yamamoto et al. ......... 714/763 |
| 6,526,538 | B1 | * | 2/2003 | Hewitt ....................... 714/780 |
| 6,715,116 | B1 | * | 3/2004 | Lester et al. ................ 714/718 |

OTHER PUBLICATIONS

Hegde, Anupama, "Error Detection and Correction with IDT49C466," Integrated Device Technology, Inc., Appl. Note AN–94, 1996, pp. 131–141.

Supplement A.6–5, "Error Detection and Correction," *Logic and Computer Design Fundamentals*, 1997, 2000 Prentic-Hall, Inc., pp. 1–5.

Wickman et al., "Cost Models for Large File Memory DRAMs with ECC and Bad Block Marking," Department of Electrical and Computer Engineering, University of Alberta, Edmonton, AB T6G 2G7, Canada, pp. 1–9.

* cited by examiner

*Primary Examiner*—Stephen M. Baker
(74) *Attorney, Agent, or Firm*—Meyertons Hood Kivlin Kowert & Goetzel, P.C.; B. Noël Kivlin

(57) ABSTRACT

A method for operating a data processing system is provided. The method includes receiving a plurality of data segments, and for each of the plurality of data segments, generating an error correction code (ECC) corresponding to the data segment, said ECC providing at least one-bit error correction capability. Finally, an extended parity segment is calculated from the plurality of data segments and the corresponding ECCs, said extended parity segment including a parity segment calculated from the plurality of data segments and a parity ECC calculated from the corresponding ECCs.

30 Claims, 5 Drawing Sheets

XOR PROCESSING INCORPORATING ERROR CORRECTION CODE DATA PROTECTION

FIELD OF THE INVENTION

This invention relates to systems and methods for XOR processing of data.

BACKGROUND

Computer systems for storing data in non-volatile form may include a plurality of storage devices, such as magnetic hard disk drives ("disk drives"), arranged in an array such that increased storage capacity and data redundancy may be achieved. Redundant storage devices are often provided to enhance the integrity of data maintained on a storage system in the event of a failure of a storage device in the system. For example, RAID ("Redundant Array of Inexpensive Disks") technology utilizes an array of disk drives which can contain data and parity information distributed across each disk drive in the array. The parity information is additional information stored on the disks which can be used to reconstruct data contained on any of the disk drives in the array in the event of a single disk drive failure. In this manner, these RAID disk arrays can improve the data integrity of the storage system by providing for data recovery despite the failure of a disk drive.

In some RAID storage systems, such as, for example, the StorEdge (TM) T3 Array by Sun Microsystems, Inc., when a new unit of data is received by the RAID controller, the new unit of data is divided into smaller sub-units. An exclusive-OR (XOR) operation is performed on each of those sub-units by an XOR accumulator engine, thereby generating a RAID parity sub-unit, which is then stored in the storage array to provide redundancy for the data in the smaller sub-units.

It has been known to use a RAID system in which each sub-unit is divided into 8-bit bytes of data, and these 8-bit bytes of data are passed into a hardware-based XOR engine for XOR processing. During the XOR processing, a 1-bit parity value is attached to each 8-bit byte of data. After the XOR processing is completed, the 1-bit parity value is then used to check whether any of the bits in the 8-bit byte of data has been corrupted. In the event that the 1-bit parity value does not match the 8-bit byte of data, the data may be recovered from a redundant controller memory or, if no redundant controller memory is available, the parity error may cause the system to crash. The use of parity alone to protect data being processed in an XOR engine can be problematic. First, single bit errors can only be identified but not corrected. In addition, the parity check may not catch double bit errors in the data. (Note that this 1-bit parity value is different from the parity sub-unit described above and is only used as a check bit for the XOR processing.)

SUMMARY

In accordance with aspects of the present invention, a method for operating a data processing system is provided. The method comprises receiving a plurality of data segments, and for each of the plurality of data segments, generating an error correction code (ECC) corresponding to the data segment, said ECC providing at least one-bit error correction capability. Finally, an extended parity segment is calculated from the plurality of data segments and the corresponding ECCs, said extended parity segment including a parity segment calculated from the plurality of data segments and a parity ECC calculated from the corresponding ECCs.

In accordance with other aspects of the present invention, a data processing system is provided. The data processing system comprises a first interface for receiving data segments, an error correction code (ECC) generator connected to the first interface for generating an ECC corresponding to each of the data segments received by the first interface, said ECC providing at least one-bit error correction capability, each of the data segments and the corresponding ECC forming an extended data segment, an exclusive-or (XOR) module connected to the ECC generator for performing XOR calculations on the extended data segments to generate an extended parity segment, said extended parity segment comprising a parity segment and a parity ECC, and an ECC check module connected to the XOR module for recalculating a new ECC for each extended data segment and comparing the new ECC to the original ECC corresponding to that extended data segment, wherein for each extended data segment, if the new ECC does not match with the original ECC, said ECC check module is configured to restore the data segment using the original ECC. The restoration can be performed by using the original ECC and the new ECC to generate an ECC syndrome, which can then be used to restore the data segment.

In accordance with other aspects of the present invention, an article of manufacture is provided. The article of manufacture including code for operating a data processing system, wherein the code causes operations to be performed comprising receiving a plurality of data segments, for each of the plurality of data segments, generating an error correction code (ECC) corresponding to the data segment, said ECC providing at least one-bit error correction capability, and calculating an extended parity segment from the plurality of data segments and the corresponding ECCs, said extended parity segment comprising a parity segment calculated from the plurality of data segments and a parity ECC calculated from the corresponding ECCs.

In accordance with other aspects of the present invention, a storage system is provided. The storage system comprises a front end interface for receiving the data segments, a controller bus connected to the first data interface, at least one storage device, and a back end interface connected to the controller bus and the at least one storage device, said back end interface for receiving the data segments from the first data interface via the controller bus and passing the data segments to the at least one storage device. The storage system further comprises a first controller interface connected to the controller bus for receiving data segments, an error correction code (ECC) generator connected to the first interface for generating an ECC corresponding to each of the data segments received by the first interface, said ECC providing at least one-bit error correction capability, each of the data segments and the corresponding ECC forming an extended data segment, an exclusive-or (XOR) module connected to the ECC generator for performing XOR calculations on the extended data segments to generate an extended parity segment, said extended parity segment comprising a parity segment and a parity ECC, and an ECC check module connected to the XOR module for recalculating a new ECC for each extended data segment and comparing the new ECC to the original ECC corresponding to that extended data segment, wherein for each extended data segment, if the new ECC does not match with the original ECC, said ECC check module is configured to restore the data segment using the original ECC.

Other features and aspects of the invention will become apparent from the following detailed description, taken in conjunction with the accompanying drawings which illustrate, by way of example, the features in accordance with embodiments of the invention. The summary is not intended to limit the scope of the invention, which is defined solely by the claims attached hereto.

In the following description, reference is made to the accompanying drawings which forma part thereof, and which illustrate several embodiments of the present invention. It is understood that other embodiments may be utilized and structural and operational changes may be made without departing from the scope of the present invention. The use of the same reference symbols in different drawings indicates similar or identical items.

DETAILED DESCRIPTION

Some portions of the detailed description which follows are presented in terms of procedures, steps, logic blocks, processing, and other symbolic representations of operations on data bits that can be performed on computer memory. A procedure, computer executed step, logic block, process, etc., are here conceived to be a self-consistent sequence of steps or instructions leading to a desired result. The steps are those utilizing physical manipulations of physical quantities. These quantities can take the form of electrical or magnetic signals capable of being stored, transferred, combined, compared, and otherwise manipulated in a computer system. These signals may be referred to at times as bits, values, elements, symbols, characters, terms, numbers, or the like. Each step may be performed by hardware, software, or combinations of the two.

Figure 1:
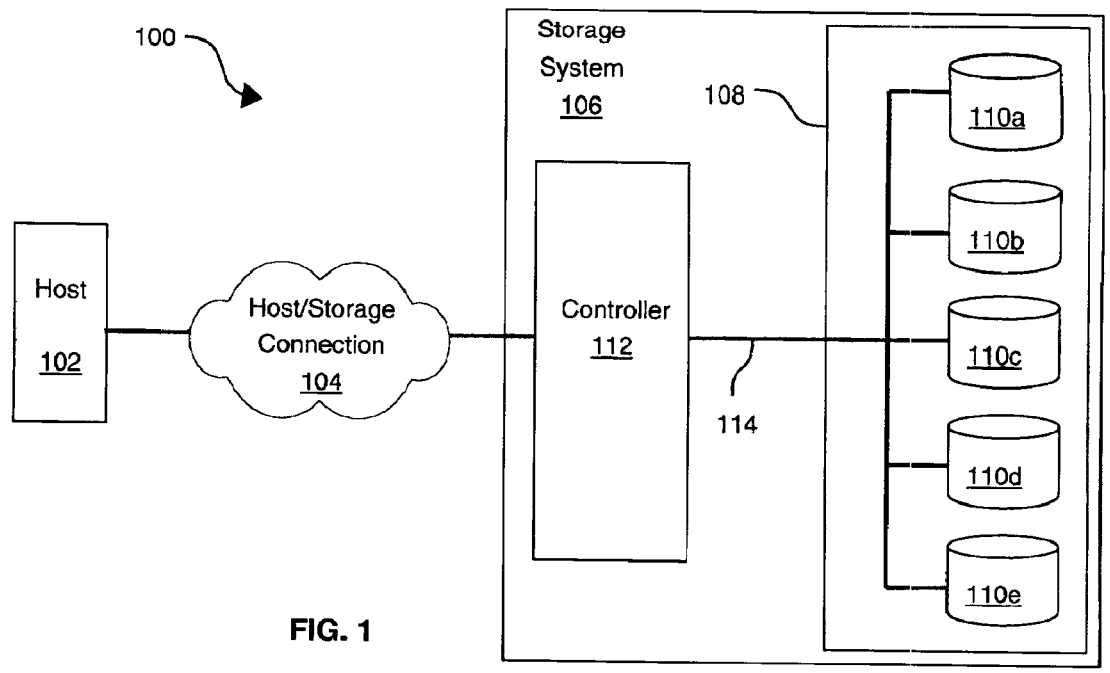
FIG. 1 shows a functional block diagram of a computer system in accordance with embodiments of the present invention.

FIG. 1 shows a functional block diagram of a computer system 100, which includes a host 102 connected to a storage system 106 via a host/storage connection 104. Host/storage connection 104 can be, for example, a local bus, a network connection, an interconnect fabric, or other communication channel. In some embodiments, a plurality of hosts 102 can be in communication with storage system 106 via host/storage connection 104, or a plurality of storage systems 106 can be in communication with one or more hosts 102.

Storage system 106 can comprise a storage device array 108 which includes a plurality of storage devices 110a–110e. Storage devices 110a–110e can be, for example, disk drives, optical drives, magneto-optical drives, tape drives, solid state storage, or other non-volatile memory. As shown in FIG. 1, storage devices 110a–110e are disk drives and storage device array 108 is a disk drive array. Although FIG. 1 shows a storage device array 108 having five storage devices 110a–110e, it is understood that the number of storage devices 110 in storage device array 108 may vary and is not limiting.

Storage system 106 may also include a controller 112 connected to each storage device 110 in storage array 108 via one or more data paths 114. Data path 114 can provide communication between controller 112 and storage devices 110 using various communication protocols, such as, for example, SCSI ("Small Computer System Interface"), FC ("Fibre Channel"), FC-AL ("Fibre Channel Arbitrated Loop"), SSA ("Serial Storage Architecture"), IEEE 1394, or IDE/ATA ("Integrated Drive Electronics"/"Advanced Technology Attachment").

Controller 112 can take many forms, depending on the design for storage system 106. In some embodiments, controller 112 may include a plurality of target-specific controllers, each target-specific controller being connected to one or more of the storage devices 110. In yet other embodiments, a plurality of controllers 112 may be provided in storage system 106 to provide for redundancy and/or performance improvements. In other embodiments, many of the functions of controller 112 can be performed by software running on host 102. These types of systems are sometimes referred to as software RAID systems.

Figure 2:
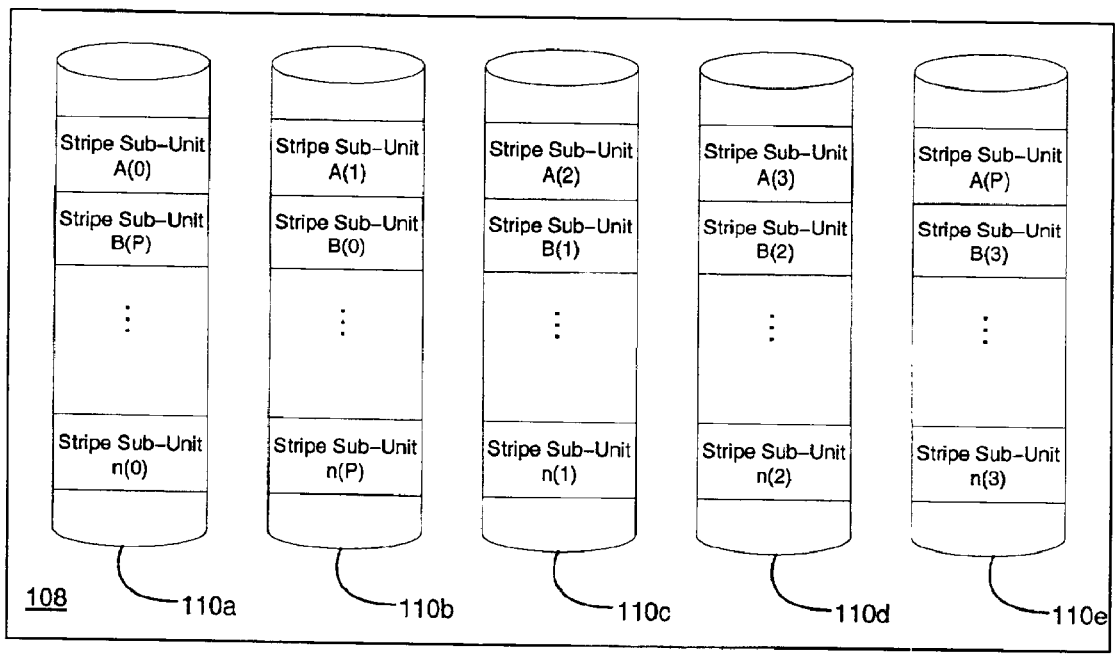
FIG. 2 shows a functional block diagram of an exemplary storage array with RAID striping in accordance with embodiments of the present invention.

FIG. 2 illustrates array 108, including storage devices 110a–110e utilizing a conventional RAID algorithm referred to as RAID 5. RAID 5 implements a striped disk array in which a unit of data is broken down into sub-units and each sub-unit is written to a separate disk drive. Each of these data sub-units can vary in size and can be, for example, 16 KB, 32 KB, or 64 KB. An additional sub-unit, referred to as a RAID parity sub-unit or parity block, is calculated based on the values of the other sub-units and is written to a separate disk drive. The data sub-units and the RAID parity sub-unit are referred to as a RAID parity group or a stripe.

In general, the RAID parity sub-unit is calculated by performing an XOR calculation on the data stored in each of the data sub-units forming the stripe. Because of the large size of each sub-unit, it may be advantageous for the XOR calculation to be performed on smaller segments of the sub-units to decrease the size of the XOR circuit used to perform the XOR calculation. For example, each 16 KB sub-unit may be divided into 2,000 data segments, each data segment being 64-bits. The RAID parity sub-unit can be generated by performing an XOR calculation on the first data segment of each sub-unit A(0)–A(3) to generate a first 64-bit RAID parity segment. Next, an XOR calculation is performed on the next data segment of each sub-unit A(0)–A(3) to generate a second RAID parity segment. This is repeated until all 2,000 data segments for each sub-unit A(0)–A(3) have been processed through the XOR calculation to produce 2,000 RAID parity segments. These 2,000 RAID parity segments can be combined to form a single RAID parity sub-unit A(P).

Figure 3:
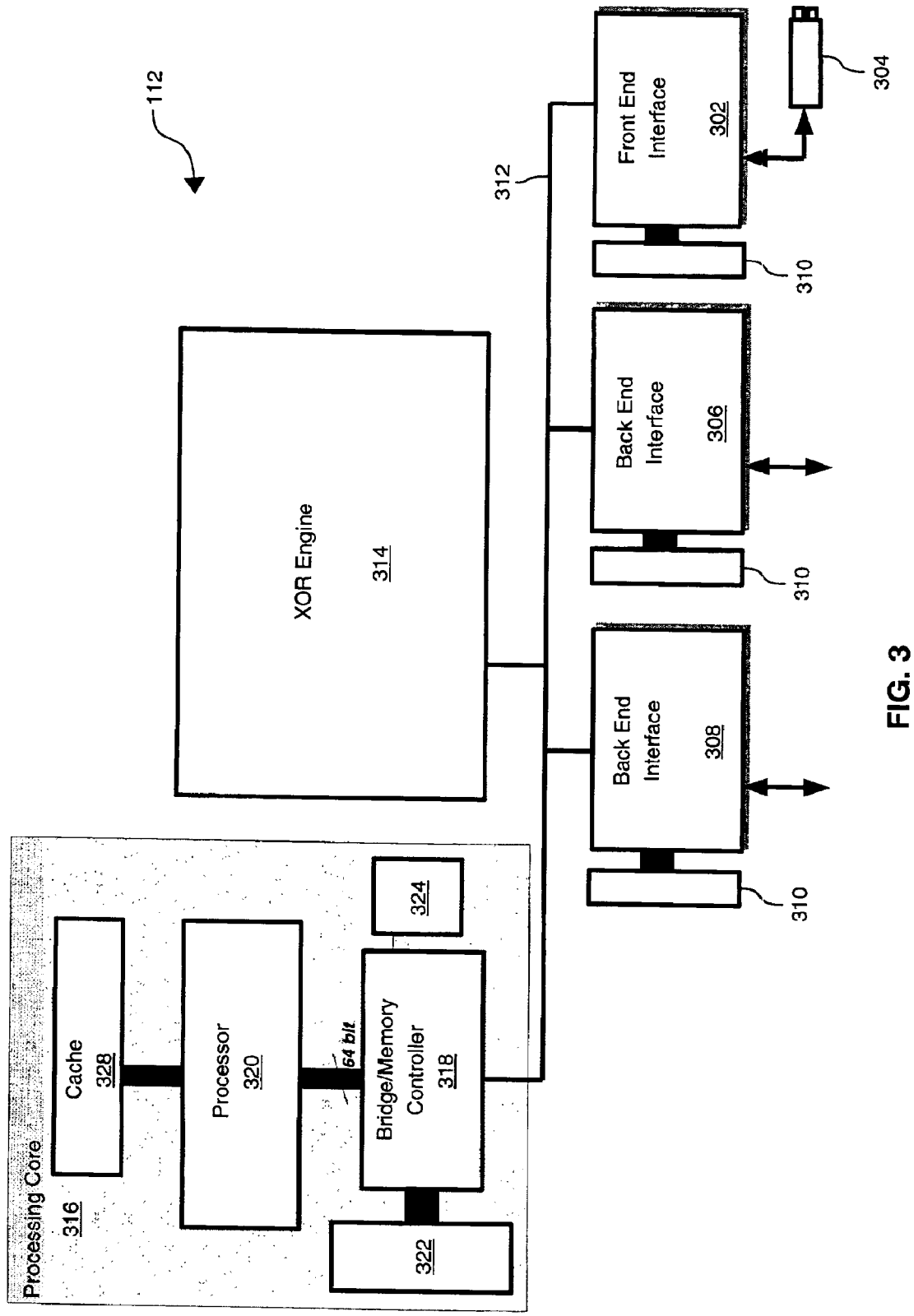
FIG. 3 shows a functional block diagram of a storage controller in accordance with embodiments of the present invention.

FIG. 3 illustrates in simplified form a controller 112 in accordance with various embodiments of the present invention. Controller 112 includes a controller bus 312, which can be, for example, a 64-bit PCI bus. Controller bus 312 is connected to a front end interface 302 which can be connected via a transceiver 304 to host/storage connection 104, thereby providing an interface between storage system 106 and host(s) 102. Controller bus 312 is also connected to a pair of back end interfaces 306, 308, which connect to storage devices 110a–110e via data paths 114. Front end interface 302 and back end interfaces 306, 308 may comprise, for example, a PCI-to-Fibre Channel host bus adapters such as the model ISP2200A/33 from the QLogic Corporation in Aliso Viejo, Calif., and may be provided with a memory 310, which can be, for example, a synchronous random access memory (SRAM). These ISP2200A/33 interfaces 302, 306, 308 can provide connectivity between the 64-bit PCI controller bus 312 and a Fibre Channel loop or to a point-to-point Fibre Channel port. Memories 310 can provide interfaces 302, 306, and 308 with program memory and control information storage.

Controller bus 312 is also connected to a processing core 316. Processing core 316 includes a bridge/memory controller 318, which is connected to a processor 320, a processor memory 322, and a firmware memory 324. Processor 320 is connected to a Level 2 cache memory 328. Bridge/memory controller 318 can be, for example, a model MPC107 PCI bridge/integrated memory controller, and processor 320 can be a PowerPC Model 750, both from Motorola, Inc., of Schaumburg, Ill. Processor memory 322 can be a synchronous dynamic random access memory (SDRAM) 322 for storing operational information and code. Firmware memory 324 can provide all boot and operational code for storage system 106 and can be, for example, a 4 MB flash memory.

Figure 4:
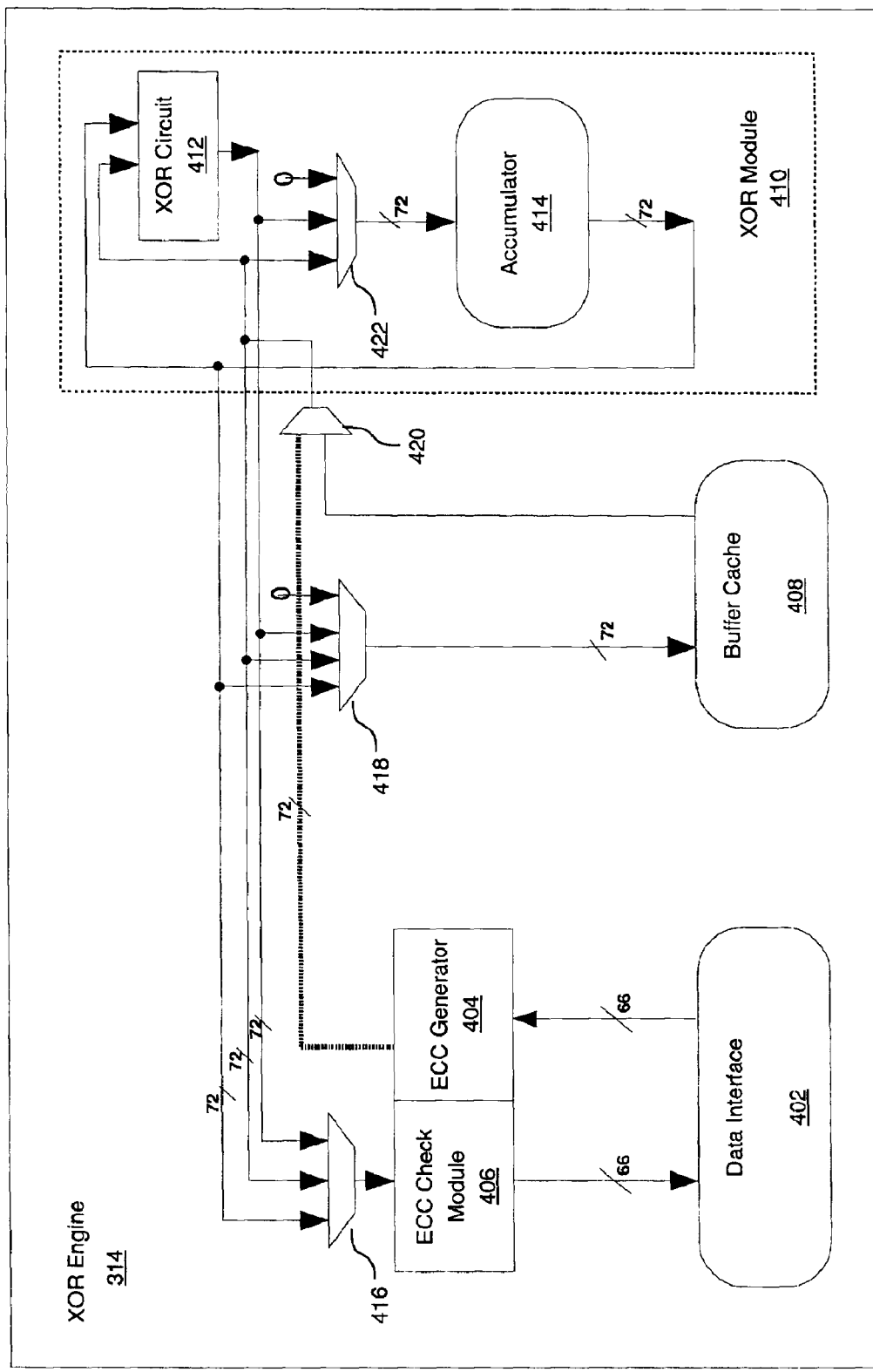
FIG. 4 shows a functional block diagram of an exclusive-or (XOR) engine in accordance with embodiments of the present invention.

Controller bus 312 is also connected to an exclusive-or (XOR) engine 314, an example of which is shown in greater detail in FIG. 4. Data interface 402 connects XOR engine 314 to controller bus 312. XOR engine also includes error correction code (ECC) generator 404, ECC check module 406, buffer cache 408, and XOR module 410. XOR module 410 comprises an XOR circuit 412 and an accumulator 414. Bus multiplexor (MUX) 416, buffer MUX 418, XOR MUX 420, and accumulator MUX 422 provide multiplexing for the data being transmitted between the elements of XOR engine 314.

In some embodiments, buffer cache 408 may comprise a 256 MB, 512 MB, or 1024 MB SDRAM memory. Accumulator 414 can be a video RAM (VRAM) type memory, which can enable simultaneous reads and writes to accumulator 414. XOR circuit 412 can be formed from a field programmable gate array (FPGA) module, such as those manufactured by the Altera Corporation of San Jose, Calif.

Figure 5:
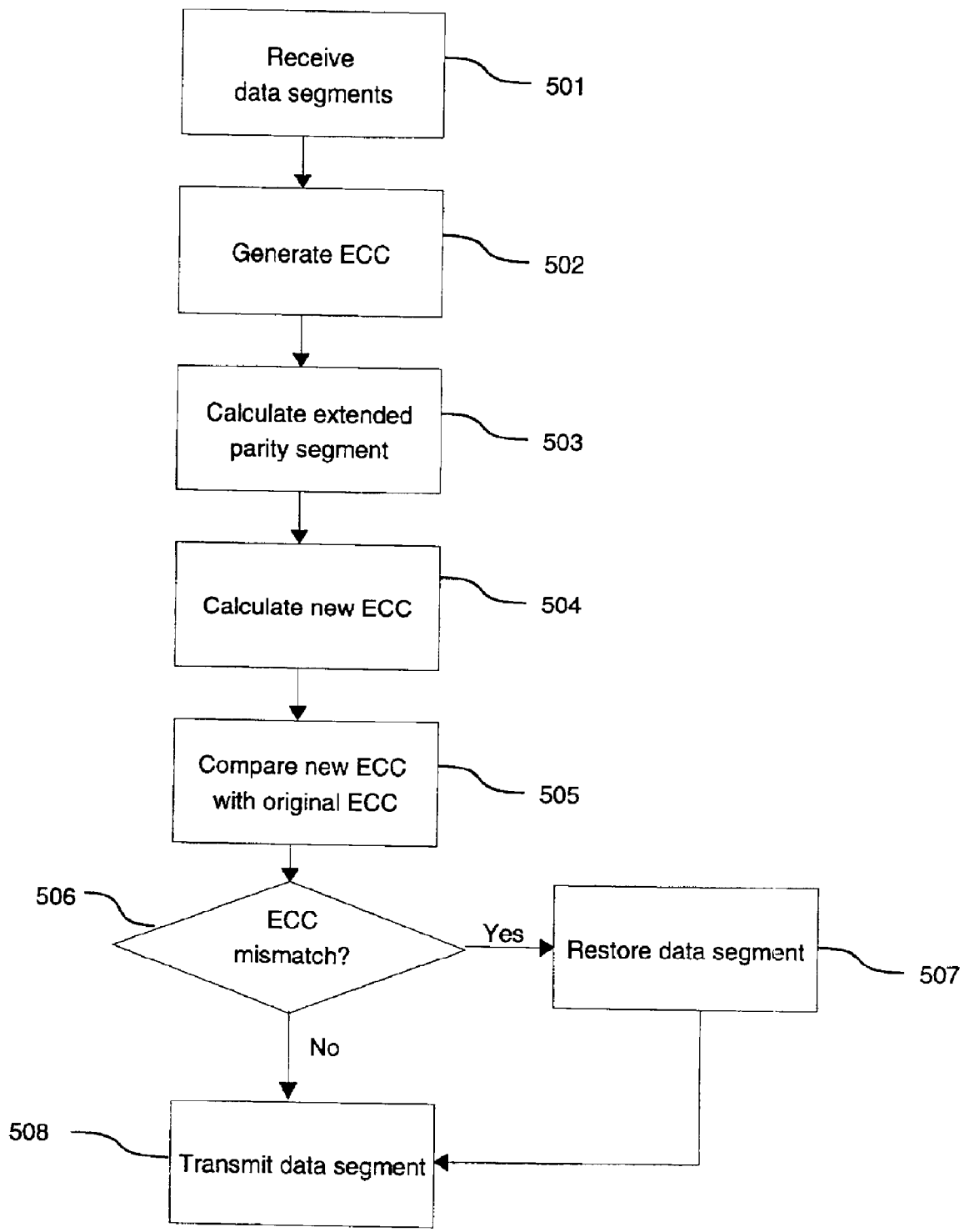
FIG. 5 shows a flowchart of a method for operating a data processing system in accordance with embodiments of the present invention.

FIG. 5 shows a method of operating a data processing system in accordance with various embodiments of the present invention. In step 501, a plurality of data segments are received. In step 502, for each of these data segments, an ECC is generated. In step 503, a RAID extended parity segment is generated. This RAID extended parity segment comprises a parity segment and a parity ECC. The parity segment is calculated based on the plurality of data segments, and the parity ECC is calculated based on the plurality of ECCs corresponding to the plurality of data segments. In other embodiments, additional steps 504–508 may also be provided. In step 504, a new ECC is generated for each of the plurality of data segments. In step 505, each new ECC is compared to the original ECC corresponding to that data segment. In step 506, if a mismatch between the new ECC and the original ECC is identified, then in step 507, the data segment is restored. Finally, in step 508, the data segment is transmitted to its destination.

One embodiment of the present invention as practiced with the system illustrated in FIGS. 1–4 is described as follows. First, host 102 transmits a write request via host/storage connection 104 to storage system 106 containing a portion of data to be stored in storage system 106. This write request is received by transceiver 304 and travels to front end interface 302. Processor 320 generates a command list which it transmits to front end interface 302. Using this command list, front end interface 302 then divides the portion of data into one or more units of data, and then divides each unit of data into a plurality of sub-units (e.g., as shown in FIG. 2, each unit is used to generate a single RAID stripe and is divided into four sub-units A(0)–A(3)). Each of these sub-units is then transmitted to XOR engine 314 to be stored into buffer cache 408 and the XOR operations processed.

Each of these sub-units are received by data interface 402 in XOR engine 314 and are processed through ECC generator 404 in 64-bit data segments. As the data segments are received, ECC generator 404 generates an 8-bit ECC corresponding to each of these 64-bit data segments. The data segment and its corresponding ECC form an extended data segment, which is stored in buffer cache 408 and processed through the XOR logic.

The plurality of data segments received by data interface 402 are processed by XOR module 410 to produce an extended parity segment in a RAID 5 system as follows. A 72-bit extended parity segment comprising a 64-bit parity segment and an 8-bit parity ECC is initially generated with all 72 bits set to "0" and is stored in accumulator 414. When the first extended data segment (comprising a 64-bit data segment and an 8-bit ECC) is stored in buffer cache 408, the extended parity segment is retrieved from accumulator 414, and XOR circuit 412 accumulates each of the bits in the extended parity segment with each bit in the first extended data segment, and stores the results from the XOR calculation in accumulator 414 as an updated extended parity segment. This extended parity segment is then transmitted from accumulator 414 to XOR circuit 412 for XOR processing with a second extended data segment being saved into buffer cache 408. XOR circuit 412 performs the XOR calculation on the extended parity segment and the second extended data segment, and stores the results in accumulator 414 as a newly updated extended parity segment. This extended parity segment is again transmitted to XOR circuit 412 for XOR processing with a third extended data segment, the results of the XOR calculation again being stored in accumulator 414 as an updated extended parity segment. Finally, this extended parity segment is transmitted to XOR circuit 412 for XOR processing with a fourth extended data segment to produce another updated extended parity segment. At this point, the XOR processing has been performed across all four of the RAID stripe sub-units, so the extended parity segment is complete. This extended parity segment can then be returned to accumulator 414, stored directly in buffer cache 408, or transmitted to ECC check module 406.

Next, a second plurality of extended data segments are received for XOR processing. The XOR processing is repeated until the XOR calculation has been performed on all of the data segments spanning each RAID data sub-unit. The number of times the XOR calculation is repeated can vary. In the example described above in which each sub-unit is 16 KB and is divided into 2,000 64-bit data segments, this process is repeated 8,000 times to produce 2,000 parity segments. These 2,000 parity segments can then be combined to form a single parity sub-unit (e.g., parity sub-unit A(P)).

Figure 6:
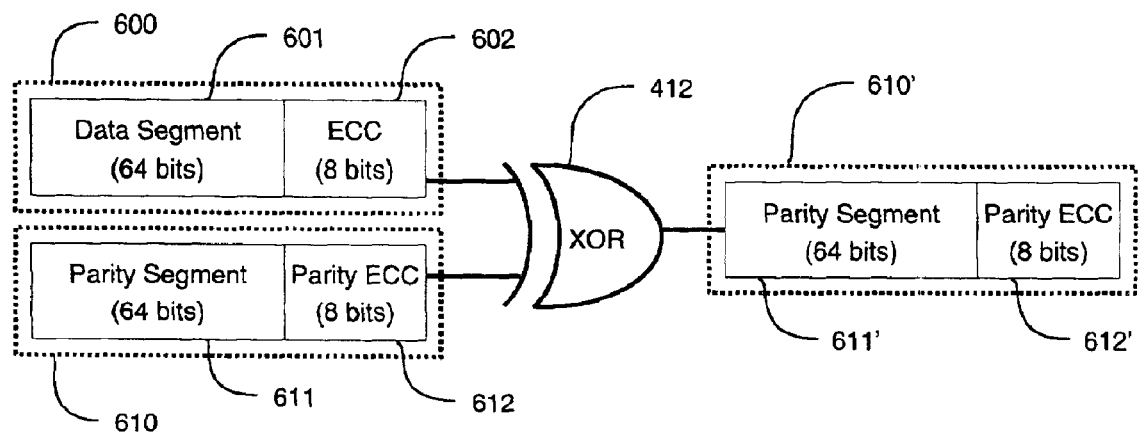
FIG. 6 shows an XOR calculation process in accordance with embodiments of the present invention.
Figure 7:
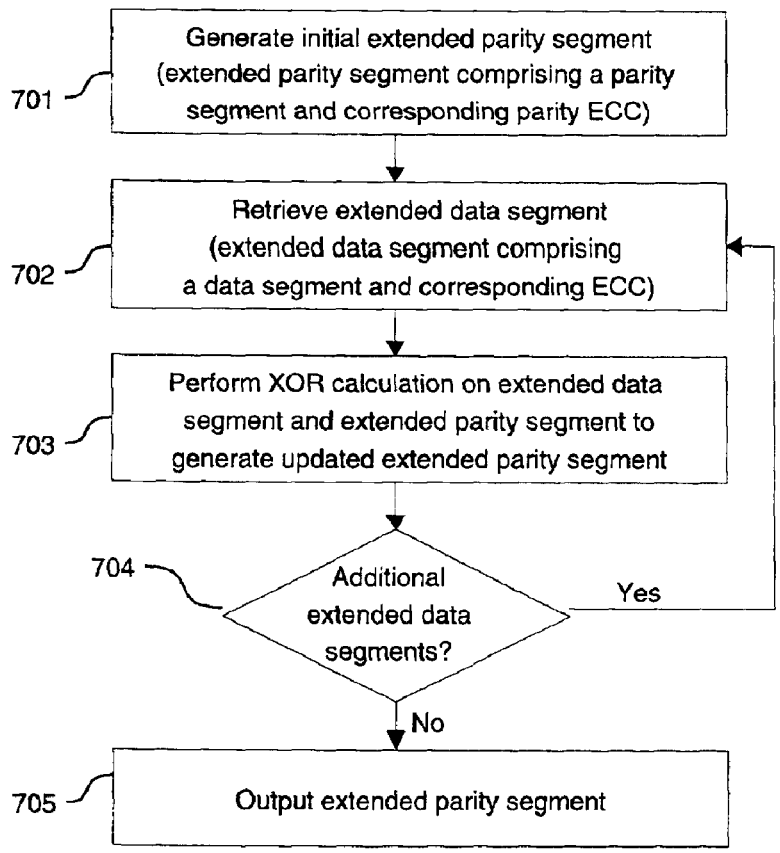
FIG. 7 shows a flowchart of a method for performing an XOR calculation in accordance with embodiments of the present invention.

When the XOR calculation is performed on each extended data segment, both the data segment and its corresponding ECC are processed by XOR circuit 412. This is process is illustrated in FIGS. 6–7. In FIG. 6, an extended data segment 600 formed by a 64-bit data segment 601 and its corresponding 8-bit ECC 602 is processed through XOR circuit 412 with an extended parity segment 610 formed by a 64-bit parity segment 611 and its corresponding 8-bit parity ECC 612 to produce an updated extended parity segment 610' formed of an updated parity segment 611' and an updated parity ECC 612'. According to this process, the updated parity ECC 612' is calculated by performing an XOR function on the bits of data contained within ECC 602 and parity ECC 612.

FIG. 7 shows a flowchart for performing the XOR processing of step 503 in accordance with various embodiments of the present invention. In step 701, an initial extended parity segment 610 comprising a parity segment 611 and a parity ECC 612 is generated. In step 702, a first extended data segment 600 comprising data segment 601 and corresponding ECC 602 is retrieved. This first extended data segment 600 may come directly from ECC generator 404 or from buffer cache 408. In step 703, an XOR calculation is performed by XOR circuit 412 on extended data segment 600 and extended parity segment 610 to generate updated extended parity segment 610'. In step 704, if there are additional extended data segments remaining, the process returns to step 702 and the next extended data segment is retrieved. When all of the extended data segments spanning a RAID stripe have been processed, the final updated extended parity segment 610' is outputted to either buffer cache 408 or ECC check module 406.

After each extended data segment has been processed through XOR module 410, the extended data segments and corresponding extended parity segment can be stored in buffer cache 408 until storage system 106 is ready to write the data into storage devices 110 or until the data is requested by host 102. At this point, each extended data segment is retrieved from buffer cache 408 and transmitted through XOR MUX 420 and bus MUX 416 to ECC check module 406. ECC check module 406 takes the data segment from the extended data segment and calculates a new ECC for that data segment. This newly calculated ECC is compared to the original ECC contained within the extended data segment. If the new ECC and the original ECC are found to match, then the data segment can be transmitted back to bus 312 and out one of the back end interfaces 306, 308 to be stored in one of the non-volatile storage devices 110.

If the new ECC does not match with the original ECC, this indicates that one or more of the bits in the extended data segment has been corrupted at some point during the XOR processing. In this case, the error-correcting capabilities of the ECC can be used to repair the corrupted bits of the data segment, and then the restored data segment is transmitted to bus 312 for storage. Thus, in accordance with embodiments of the present invention, the data segments processed by XOR engine 314 can be protected by an error correction code throughout the entire XOR calculation and storage process.

As is understood by those of ordinary skill in the art, error correction codes are used to detect and correct errors in data. In accordance with embodiments of the present invention, for each data segment received by XOR engine 314, ECC generator 404 calculates an error correction code that describes the bit sequence in that data segment and transmits that ECC with the data segment for XOR processing. As described above, the data segment and its corresponding ECC together form an extended data segment. When that data segment is to be output by XOR engine 314, ECC check module 406 calculates a new ECC using the same methodology as used by ECC generator 404, and compares that new ECC with the original ECC. If the two ECCs match, the data in the data segment can be considered to be free of errors. If the two do not match, the corrupted data segment is corrected using the information contained in the original ECC code.

The error correction code used in accordance with embodiments of the present invention can be generated in numerous ways, and different ECC algorithms can provide different levels of redundancy for the data segment. A feature of the ECC of this invention is that the ECC can be used to correct at least single-bit errors in the data segment. For example, in some embodiments, a modified Hamming code is used as the methodology for calculating the error correction codes, thereby providing single-bit error correction and double-bit error detection (SEC-DED) capability. Modified Hamming codes have been implemented to provide error correction in DRAM memory modules and are well known in the art. When using a modified Hamming code as the ECC methodology, when ECC check module 406 generates a new ECC and compares it to the original ECC, the comparison generates an 8-bit syndrome. This 8-bit syndrome can be decoded to determine whether an error has occurred and, if a one-bit error is indicated, the syndrome can be used to restore the original data segment. Accordingly, in some embodiments, the corrupted data segment is corrected based on information contained in both the new ECC and the original ECC.

In other embodiments, a different error correction code may be used which provides double-bit or greater error correction capability. One limitation on the degree of redundancy provided by the ECC is the number of bits allocated to the ECC portion of the extended data segment. In the embodiment shown in FIGS. 4 and 6, the data segments are 64-bits and the corresponding ECCs are 8-bits—an 8:1 ratio. In other embodiments, a larger or smaller ECC relative to the size of the data segment can be used. When ECC check module 406 detects an error which is beyond its capability to correct (e.g., if an SEC-DED modified Hamming code is used and a double-bit error is discovered), a number of recovery mechanisms can be performed to retrieve the lost data. For example, the data segment could be retrieved from a redundant controller memory. In other embodiments, standard RAID techniques can be used to recover the damaged data segment using the data in the parity segment and three other data segments spanning the stripe. In yet other embodiments, the host may retransmit the data to recover the lost data segment.

In some embodiments, the error correction code is also mathematically consistent with the XOR calculation performed by XOR circuit 412. A benefit derived from this mathematical consistency can be seen with reference to FIG. 6. As described above, updated parity segment 610' is generated by performing an XOR function on data segment 601 and parity segment 611, and updated parity ECC 612' is generated by performing an XOR function on ECC 602 and parity ECC 612. However, if a mathematically consistent error correction code, such as a modified Hamming code, is used to generate a new ECC for parity segment 611', this new ECC would be identical to the parity ECC 612' produced by the XOR circuit 412. Accordingly, ECC check module 406 can be used to detect and correct errors in the extended parity segment as well as in the data segments, as described above with respect to steps 505–508.

While the invention has been described in terms of particular embodiments and illustrative figures, those of ordinary skill in the art will recognize that the invention is not limited to the embodiments or figures described. In particular, while the above embodiments describe the process and system used for RAID 5 storage of data, other data storage methodologies may be used. In addition, while the modified Hamming code methodology has been discussed above, various methodologies may be used to calculate the ECC for each data segment.

The described XOR processing architecture may be implemented as a method, apparatus, or article of manufacture using standard programming and/or engineering techniques to produce software, firmware, hardware, or any combination thereof. The term "article of manufacture" as used herein refers to code or logic implemented in hardware logic (e.g., an integrated circuit chip, Field Programmable Gate Array (FPGA), Application Specific Integrated Circuit (ASIC), etc.) or a computer readable medium (e.g., magnetic storage medium (e.g., hard disk drives, floppy disks, tape, etc.), optical storage (CD-ROMs, optical disks, etc.), volatile and non-volatile memory devices (e.g., EEPROMs, ROMs, PROMs, RAMs, DRAMs, SRAMs, firmware, programmable logic, etc.)). Code in the computer readable medium is accessed and executed by a processor. The code in which some embodiments are implemented may further be accessible through a transmission media or from a file server over a network. In such cases, the article of manufacture in which the code is implemented may comprise a transmission media, such as a network transmission line, wireless transmission media, signals propagating through space, radio waves, infrared signals, etc. Of course, those of ordinary skill in the art will recognize that many modifications may be made to this configuration without departing from the scope of the present invention, and that the article of manufacture may comprise any information bearing medium known in the art.

In various embodiments, the methods and systems of the present invention may be directed to a data processing system. This data processing system may include any or all of the various components described above. For example, the data processing system may comprise an XOR engine similar to XOR engine 314, may comprise all of controller 112, may comprise an entire storage system similar to storage system 106, or may comprise all of computer system 100, including host 102, host/storage connection 104, and storage system 106. Numerous variations are possible, as defined in the claims below.

In addition, the architecture of a data processing system in accordance with the present invention need not be identical to the architectures described and illustrated herein, and numerous variations are possible. For example, the sizes of the data segments, the memories, and the data buses can vary and are not limited to the embodiments described.

Finally, the steps of the various methods described above need not necessarily be performed in the order described. For example, in some embodiments, the ECC is generated in real-time as each data segment is received. In other embodiments, all of the data segments may be received, and the corresponding ECCs generated and appended later. In addition, the checking of the ECC can be performed at any time and need not be performed by ECC check module 406 right before the data segment is output by XOR engine 314.

Therefore, it should be understood that the invention can be practiced with modification and alteration within the spirit and scope of the appended claims. The description is thus to be regarded as illustrative instead of limiting on the invention.

What is claimed is:

1. A method of operating a data processing system, comprising: receiving a plurality of data segments; for each of the plurality of data segments, generating an error correction code (ECC) corresponding to the data segment, said ECC providing at least one-bit error correction capability; and calculating an extended parity segment from the plurality of data segments and the corresponding ECCs, said extended parity segment comprising a parity segment calculated from the plurality of data segments and a parity ECC calculated from the corresponding ECCs; wherein said calculating the extended parity segment from the plurality of data segments and the corresponding ECCs includes: performing a first exclusive-or (XOR) calculation on an extended parity segment and a first extended data segment to produce an updated extended parity segment, said first extended data segment comprising a first data segment in the plurality of data segments and the corresponding ECC; and performing additional XOR calculations on the updated extended panty segments and additional extended data segments, each additional XOR calculation producing an updated extended parity segment, said additional extended data segments each comprising one of the plurality of data segments and the corresponding ECC.

2. The method of claim 1, wherein: said calculating the extended parity segment from the plurality of data segments and the corresponding ECCs further comprises storing the updated extended parity segment in an accumulator.

3. The method of claim 1, further comprising: transmitting each of the plurality of data segments and the parity segment to a non-volatile storage device.

4. The method of claim 1, further comprising: generating a write request from a host computer, said write request including a unit of data to be stored; and dividing the unit of data into a plurality of stripe sub-units; wherein each of said plurality of data segments comprises a portion of one of the plurality of stripe sub-units.

5. The method of claim 1, further comprising: using the parity segment to calculate a new parity ECC; comparing the new parity ECC with the parity ECC contained within the extended parity segment; and if the new parity ECC does not match with the parity ECC contained within the extended parity segment, then restoring the parity segment based on the parity ECC contained within the extended parity segment.

6. The method of claim 1, further comprising, for each of the plurality of data segments: recalculating a new ECC corresponding to the data segment; comparing the new ECC with the original ECC for the corresponding data segment; and if the new ECC does not match with the original ECC for the corresponding data segment, then restoring the corresponding data segment based on the original ECC.

7. The method of claim 6, wherein, for each of the plurality of data segments: said generating the ECC corresponding to the data segment comprises utilizing a modified Hamming code to generate the ECC; said comparing the new ECC with the original ECC for the corresponding data segment produces an EGG syndrome; and said restoring the corresponding data segment based on the original ECC comprises restoring the corresponding data segment using the ECC syndrome.

8. The method of claim 6, further comprising, for each of the plurality of data segments: if the new ECC does not match with the original ECC for the corresponding data segment and the data segment cannot be restored based on the original ECC, then generating a signal indicating a data integrity error.

9. A data processing system, comprising: a first data interface for receiving data segments; an error correction code (ECC) generator connected to the first data interface for generating an ECC corresponding to each of the data segments received by the first data interface, said ECC providing at least one-bit error correction capability, each of the data segments and the corresponding ECC forming an extended data segment; an exclusive-or (XOR) module connected to the ECC generator for performing XOR calculations on the extended data segments to generate an extended parity segment, said extended parity segment comprising a parity segment and a panty ECC; and an ECC check module connected to the XOR module for recalculating a new ECC for each extended data segment and comparing the new ECC to the original ECC corresponding to that extended data segment, wherein for each extended data segment, if the new ECC does not match with the original ECC, said ECC check module is configured to restore the data segment using the original ECC.

10. The system of claim 9, wherein: said XOR module comprises: an XOR circuit for performing an XOR calculation on the extended parity segment and another extended data segment; and an accumulator for storing the extended parity segment.

11. The system of claim 9, wherein: said ECC generator utilizes a modified Hamming code to generate each ECC.

12. The system of claim 9, wherein: said ECC check module is configured such that for each extended data segment, if the new ECC does not match with the original ECC and the original ECC cannot be used to restore the data segment, the ECC check module generates a signal indicating a data integrity error.

13. The system of claim 9, further comprising: a buffer cache connected to the ECC generator and to the XOR module for storing the extended data segments from the ECC generator.

14. The system of claim 13, wherein: said ECC check module is configured to compare the new ECC to the original ECC by generating an ECC syndrome, and if the ECC indicates a correctable error, the ECC check module is further configured to restore the data segment using the ECC syndrome.

15. The system of claim 9, further comprising: at least one storage device; a controller bus connected to the first data interface; a front end interface connected to the controller bus for receiving the data segments and passing the data segments to the first data interface via the controller bus; and a back end interface connected to the controller bus and the at least one storage device, said back end interface for receiving the data segments from the first data interface via the controller bus and passing the data segments to the at least one storage device.

16. The system of claim 15, further comprising: a host/storage connection connected to the front end interface; and a host system connected to the host/storage connection, said host system for transmitting write requests, each of the data segments containing data from one of the write requests.

17. An article of manufacture comprising a computer readable medium including code for operating a data processing system, wherein the code causes operations to be performed comprising: receiving a plurality of data segments; for each of the plurality of data segments, generating an error correction code (ECC) corresponding to the data segment, said ECC providing at least one-bit error correction capability; and calculating an extended parity segment from the plurality of data segments and the corresponding ECCs, said extended parity segment comprising a parity segment calculated from the plurality of data segments and a parity ECC calculated from the corresponding ECCs: wherein said calculating the extended parity segment from the plurality of data segments and the corresponding ECCs comprises: performing a first exclusive-or (XOR) calculation on a extended parity segment and a first extended data segment to produce an updated extended parity segment, said first extended data segment comprising a first data segment in the plurality of data segments and the corresponding ECC: and performing additional XOR calculations on the updated extended parity segment and additional extended data segments, each additional XOR calculation producing an updated extended parity segment, said additional extended data segments each comprising one of the plurality of data segments and the corresponding ECC.

18. The article of manufacture of claim 17, wherein: said calculating the extended parity segment from the plurality of data segments and the corresponding ECCs further comprises storing the updated extended parity segment in an accumulator.

19. The article of manufacture of claim 17, further comprising code causing operations to be performed comprising: transmitting each of the plurality of data segments and the parity segment to a non-volatile storage device.

20. The article of manufacture of claim 17, further comprising code causing operations to be performed comprising: generating a write request from a host computer, said write request including a unit of data to be stored; and dividing the unit of data into a plurality of stripe sub-units; wherein each of said plurality of data segments comprises a portion of one of the plurality of stripe sub-units.

21. The article of manufacture of claim 17, further comprising code causing operations to be performed comprising: using the parity segment to calculate a new parity ECC; comparing the new parity ECC with the parity ECC contained within the extended parity segment; and if the new parity ECC does not match with the parity ECC contained within the extended parity segment, then restoring the parity segment based on the parity ECC contained within the extended parity segment.

22. The article of manufacture of claim 17, further comprising code causing operations to be performed comprising: for each of the plurality of data segments: recalculating a new ECC corresponding to the data segment; comparing the new ECC with the original ECC for the corresponding data segment; and if the new ECC does not match with the original ECC for the corresponding data segment, then restoring the corresponding data segment based on the original ECC.

23. The article of manufacture of claim 22, wherein: for each of the plurality of data segments: said generating the ECC corresponding to the data segment comprises utilizing a modified Hamming code to generate the ECC; said comparing the new ECC with the original ECC for the corresponding data segment produces an ECC syndrome; and said restoring the corresponding data segment based on the original ECC comprises restoring the corresponding data segment using the ECC syndrome.

24. The article of manufacture of claim 22, further comprising code causing operations to be performed comprising: for each of the plurality of data segments, if the new ECC does not match with the original ECC for the corresponding data segment and the data segment cannot be restored based on the original ECC, then generating a signal indicating a data integrity error.

25. A storage system, comprising: a front end interface for receiving data segments; a controller bus connected to the front end interface; at least one storage device; a back end interface connected to the controller bus and the at least one storage device, said back end interface for receiving the data segments from the first data interface via the controller bus and passing the data segments to the at least one storage device; a controller interface connected to the controller bus for receiving data segments; an error correction code (ECC) generator connected to the controller interface for generating an ECC corresponding to each of the data segments received by the controller interface, said ECC providing at least one-bit error correction capability, each of the data segments and the corresponding ECC forming an extended data segment; an exclusive-or (XOR) module connected to the ECC generator for performing XOR calculations on the extended data segments to generate an extended parity segment, said extended parity segment comprising a parity segment and a parity ECC; and an ECC check module connected to the XOR module for recalculating a new ECC for each extended data segment and comparing the new ECC to the original ECC corresponding to that extended data segment, wherein for each extended data segment, if the new ECC does not match with the original ECC, said ECC check module is configured to restore the data segment using the original ECC.

26. The system of claim 25, wherein: said XOR module comprises: an XOR circuit for performing an XOR calculation on the extended parity segment and another extended data segment; and an accumulator for storing the extended parity segment.

27. The system of claim 25, wherein: said ECC generator utilizes a modified Hamming code to generate each ECC.

28. The system of claim 25, wherein: said ECC check module is configured such that for each extended data segment, if the new ECC does not match with the original ECC and the original ECC cannot be used to restore the data segment, the ECC check module generates a signal indicating a data integrity error.

29. The system of claim 25, further comprising: a buffer cache connected to the ECC generator and to the XOR module for storing the extended data segments from the ECC generator.

30. The system of claim 29, wherein: said ECC check module is configured to compare the new ECC to the original ECC by generating an ECC syndrome, and if the ECC indicates a correctable error, the ECC check module is further configured to restore the data segment using the ECC syndrome.

* * * * *

UNITED STATES PATENT AND TRADEMARK OFFICE
CERTIFICATE OF CORRECTION

PATENT NO. : 6,883,131 B2
DATED : April 19, 2005
INVENTOR(S) : John D. Acton

It is certified that error appears in the above-identified patent and that said Letters Patent is hereby corrected as shown below:

Column 10,
Line 20, please delete "extended panty segments" and substitute -- extended parity segment --.
Line 58, please delete "produces an EGG syndrome; and" and substitute -- produces an ECC syndrome; and --.

Column 11,
Line 12, please delete "segment and a panty ECC; and" and substitute -- segment and a parity ECC; and --.

Signed and Sealed this

Eighth Day of November, 2005

JON W. DUDAS
*Director of the United States Patent and Trademark Office*